US008076240B2

(12) United States Patent
Duong et al.

(10) Patent No.: US 8,076,240 B2
(45) Date of Patent: Dec. 13, 2011

(54) TECHNIQUES TO IMPROVE CHARACTERISTICS OF PROCESSED SEMICONDUCTOR SUBSTRATES

(75) Inventors: Anh Ngoc Duong, Union City, CA (US); Chi-l Lang, Sunnyvale, CA (US)

(73) Assignee: Intermolecular, Inc., San Jose, CA (US)

( * ) Notice: Subject to any disclaimer, the term of this patent is extended or adjusted under 35 U.S.C. 154(b) by 590 days.

(21) Appl. No.: 12/268,387

(22) Filed: Nov. 10, 2008

(65) Prior Publication Data
US 2009/0124081 A1 May 14, 2009

Related U.S. Application Data

(60) Provisional application No. 60/987,721, filed on Nov. 13, 2007.

(51) Int. Cl.
*H01L 21/44* (2006.01)

(52) U.S. Cl. ........ 438/678; 438/689; 438/745; 438/761; 438/765; 438/769; 257/E21.295

(58) Field of Classification Search .................. None
See application file for complete search history.

(56) References Cited

U.S. PATENT DOCUMENTS

2002/0028505 A1* 3/2002 Sakai et al. ................ 435/299.1
* cited by examiner

*Primary Examiner* — N Drew Richards
*Assistant Examiner* — Kyoung Lee

(57) ABSTRACT

Techniques to improve characteristics of processed semiconductor substrates are described, including cleaning a substrate using a preclean process, the substrate comprising a dielectric region and a conductive region, introducing a hydroquinone to the substrate after cleaning the substrate using the preclean operation, and forming a capping layer over the conductive region of the substrate after introducing the hydroquinone.

10 Claims, 10 Drawing Sheets

TECHNIQUES TO IMPROVE CHARACTERISTICS OF PROCESSED SEMICONDUCTOR SUBSTRATES

PRIORITY CLAIM TO PROVISIONAL APPLICATION

A claim for priority is hereby made under the provisions of 35 U.S.C. §119 for the present application based upon U.S. Provisional Application No. 60/987,721 entitled "Techniques to Improve Characteristics of Processed Semiconductor Substrates" and filed on Nov. 13, 2007, which is incorporated herein by reference.

FIELD OF THE INVENTION

The present invention relates generally to semiconductor processing. More specifically, techniques to improve characteristics of processed substrates are disclosed.

BACKGROUND OF THE INVENTION

Semiconductor processing typically includes various techniques performed on a substrate (e.g., a wafer) to form electronic devices such as integrated circuits. Examples of such techniques include layer formation using various deposition techniques (e.g., using electroless or electrochemical deposition, physical vapor deposition, or chemical vapor deposition), etching techniques, cleaning techniques, and chemical mechanical planarization.

Semiconductor processes can be used to form interconnect structures that include conductive lines to connect active regions (e.g., transistors) of the semiconductor devices. The interconnect structures typically include interleaved conductive and dielectric regions that are formed using a variety of the processes listed above.

Processed substrates often suffer from poor performance as a result of the various semiconductor processes. Characteristics of the processed substrates such as increase line resistance, capacitance between lines, and dielectric breakdown can impact semiconductor device performance and can lead to device failure.

Thus, what is needed is a technique to improve characteristics of processed semiconductor substrates.

BRIEF DESCRIPTION OF THE DRAWINGS

Various embodiments of the invention are disclosed in the following detailed description and the accompanying drawings.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

According to embodiments described herein, hydroquinone is used with various semiconductor processes to improve electrical and other characteristics of processed substrates. In one embodiment, a capping layer is deposited on an interconnect. The substrate is pre-cleaned, hydroquinone is applied, and an electroless solution is applied to the substrate to form the capping layer. The hydroquinone improves cap adhesion and further improves time dependent dielectric breakdown (TDDB) and voltage ramp breakdown (VRB) characteristics of the substrate. Hydroquinone can prevent or reduce the incidence of contaminants such as unwanted amine layers and unwanted metal particles forming on dielectrics. Hydroquinone can also improve various characteristics of substrates used with other processing techniques.

Hydroquinone to Improve Formation of Capping Layers

Hydroquinone, also known as benzene-1,4-diol or quinol, is an aromatic organic compound having the chemical formula $C_6H_4(OH)_2$. At room temperature, hydroquinone is a granular solid that can be deployed onto a substrate in solution. Hydroquinone, as described regarding various embodiments herein, can be used to improve characteristics of processed semiconductor substrates.

Figure 1:
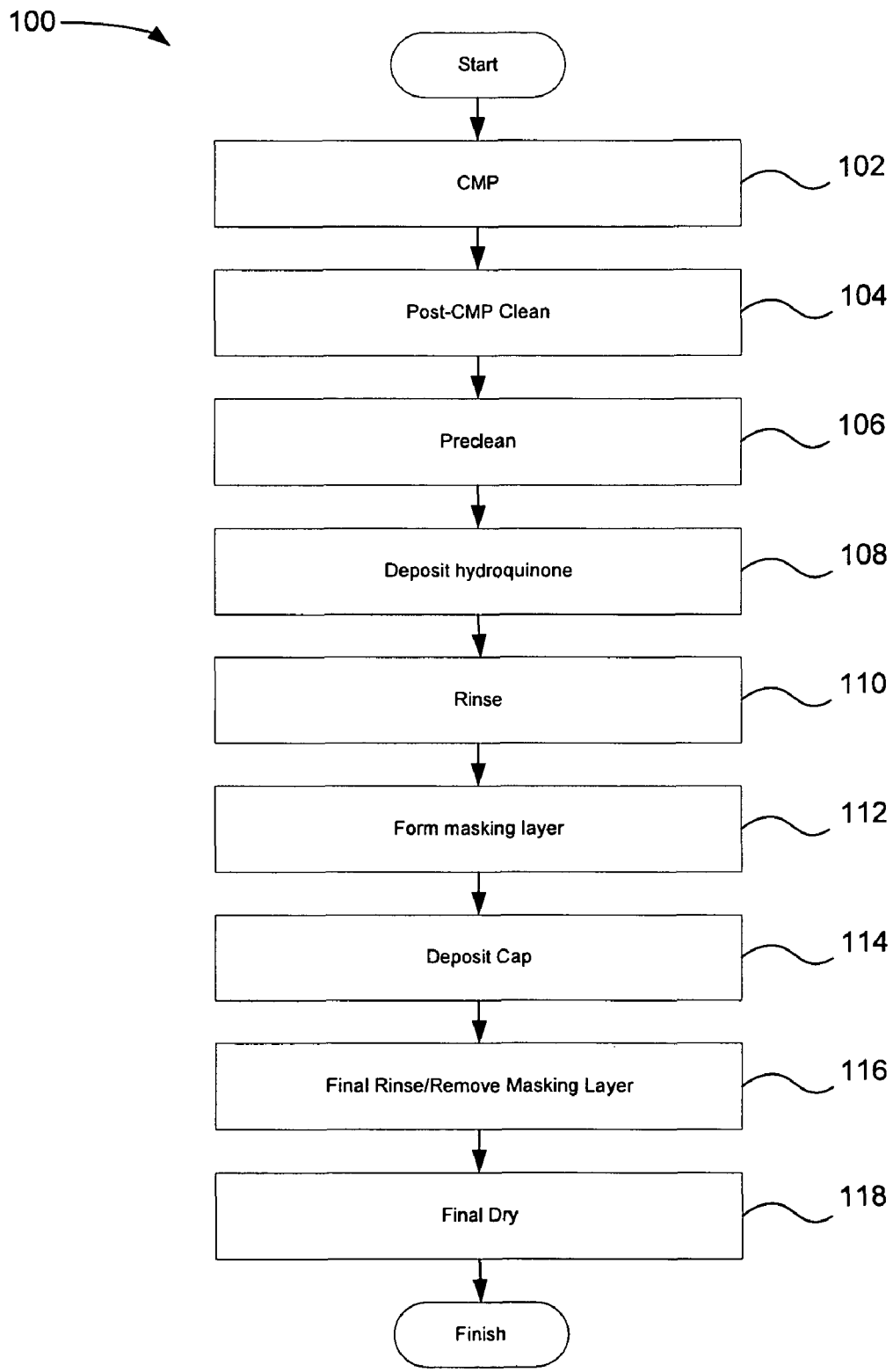
FIG. 1 is a flowchart describing a process for using hydroquinone to improve the formation of capping layers and other aqueous based processes.

FIG. 1 is a flowchart describing a process 100 for using hydroquinone to improve the formation of capping layers and other aqueous based processes. The process 100 is an example of an aqueous-based deposition such as electroless deposition on a substrate including conductive and dielectric regions. The deposition is assisted by the use of a masking layer on the dielectric regions of the substrate to isolate the conductive regions and to help limit the formation of the capping layer to the conductive (i.e., the unmasked) regions.

In one example, the process is used to deposit a capping layer on a conductive interconnect line in a semiconductor device. For example, an electroless cobalt layer may be deposited over a copper interconnect to protect upper layers of the interconnect structure against diffusion and electromigration originating from the copper interconnect. The capping layer may be needed to enable smaller feature sizes in semiconductor devices, and the application of hydroquinone during the process of forming a capping layer can improve the selectivity of the capping layer formation.

Figure 2A:
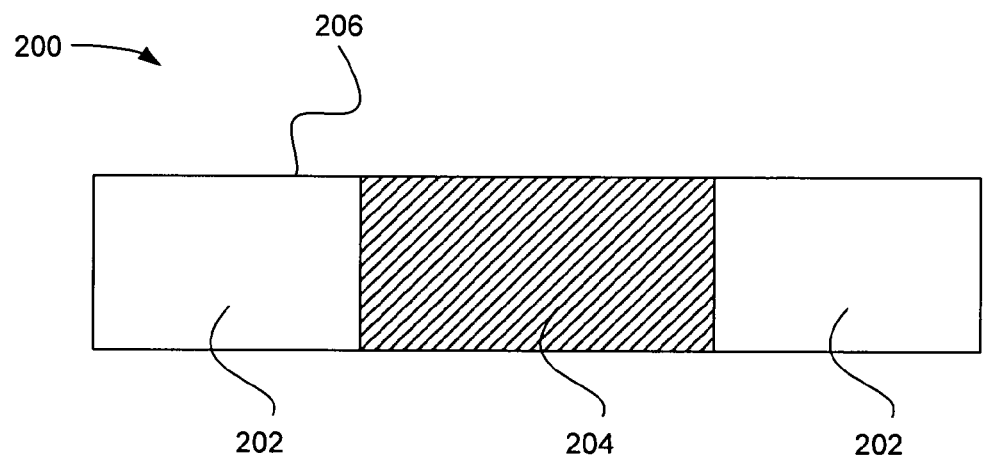
FIGS. 2A-2E illustrate a substrate having a capping layer formed on it using hydroquinone.

FIGS. 2A-2E illustrate a substrate 200 having a capping layer formed on it using hydroquinone during the process 100. FIG. 2A illustrates the substrate 200 having dielectric regions 202 and a conductive region 204. The dielectric regions 202 may be any insulating material, including but not limited to silicon dioxide, silicon carbide, silicon nitride, silicon carbonitride (SiCN), silicon oxycarbide (SiCOH), other low-k dielectrics, etc. The conductive region 204 may include one or more conductive materials such as aluminum and copper. A portion of the substrate is shown in FIGS. 2A and 2C-2E, the portion shown may be a portion of an interconnect layer formed during a back end of the line (BEOL) processing step.

The substrate 200 may include an approximately planar top surface 206 that is the result of a planarizing process such as chemical mechanical planarization (CMP) in operation 102. CMP uses a chemical slurry and an abrasive rotating platen to planarize and create a level surface on the substrate 200. The CMP process may leave slurry particles on the top surface 206 that can be removed using a post-CMP clean in operation 104. Various post-CMP cleaning solutions are available, such as the ESC-700 Series products (e.g., ESC-784) from Advanced Technology Materials Incorporated (ATMI) of Danbury, Conn.

In operation 106, the substrate 200 is pre-cleaned to prepare the substrate 200 for subsequent processing. The pre-clean solution may be, for example, the MR-10 cleaning solution from Mitsubishi Gas Chemical or any other semi-conductor cleaning solution. In some circumstances, the combination of the post-CMP clean and the pre-clean do not adequately clean the substrate, and may leave behind contaminants such as unwanted amine layers. The amine layer may interfere with subsequent processes. For example, during electroless deposition, the amine layer may cause unwanted metal particle formation on the dielectric regions 202.

Figure 2B:
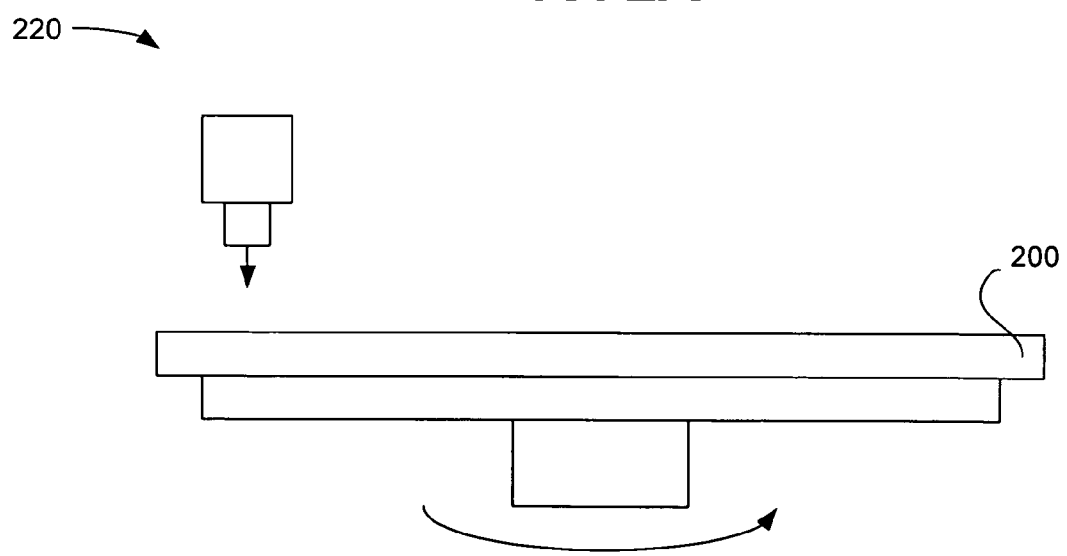

In operation 108, hydroquinone is deposited on the substrate 200. FIG. 2B illustrates an apparatus 220 for depositing hydroquinone on the substrate 200. The apparatus 220 may, in various embodiments, be a spin processor or spin coater that is used to spin the hydroquinone onto the substrate 200 surface, however, various other deposition techniques (e.g., pouring the solution onto the substrate, dipping the substrate) can also be used. In one embodiment, the solution deposited onto the substrate 200 is a mixture of hydroquinone and tetrabutylammonium acetate. The hydroquinone may have any concentration, for example 10 mM to 30 mM or 20 mM. The hydroquinone may be deposited at room temperature (e.g., 20° Celsius) or any other temperature (e.g., 10 to 30° Celsius), for any desired time (e.g., 30 to 50 seconds (s) or 40 s). Other hydroquinone solutions, including those prepared with organic solvents, a mixture of aqueous and organic solvents, acidic or basic cleaning solutions, or electroless solutions can also be used. In operation 110, the hydroquinone is spun off and then rinsed off of the substrate 200 using a hot water rinse. Other removal techniques are also possible.

Figure 2C:
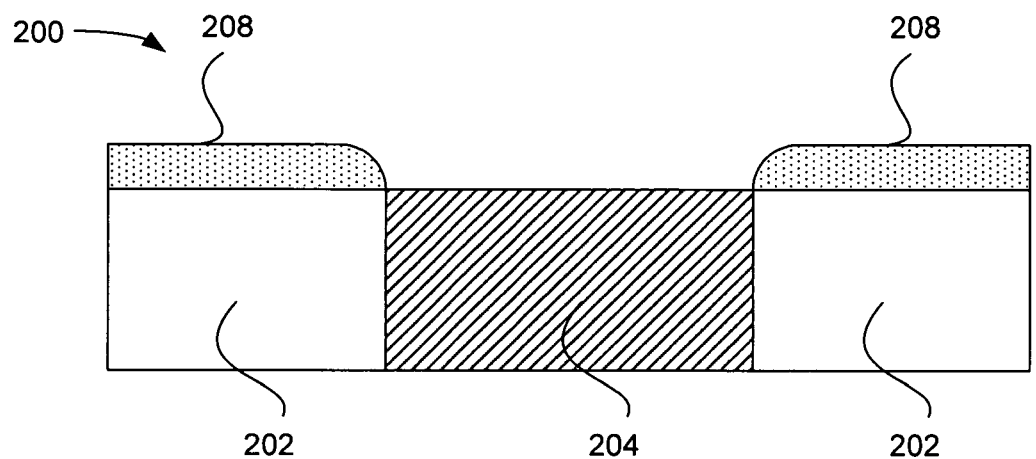

In operation 112, the masking layer is formed. FIG. 2C illustrates the substrate 200 including a masking layer 208. The masking layer 208 may or may not be a self-assembled layer, for example, and may be a monolayer, greater than a monolayer, or a submonolayer. The masking layer may be hydrophobic or hydrophilic. The masking layer may improve access to the conductive region 204 for aqueous solutions (e.g., aqueous based depositions such as electroless deposition). For example, a hydrophilic masking layer can lower the contact angle of the substrate 200, making interconnects that may be difficult to wet more accessible. In other examples, a masking layer can normalize the substrate 200 so that a consistent contact angle may be chosen that is compatible with the subsequent aqueous processes to be performed. Hydroquinone techniques can also be used with other subsequent processes, such as other subsequent aqueous processes or dry processes. For example, hydroquinone can be use to improve the deposition of layers using electrochemical deposition, atomic layer deposition (ALD), chemical vapor deposition (CVD), physical vapor deposition (PVD), with or without masking as described herein.

Various materials may be used for the masking layer. For example, the masking layer may be a hydrophobic material such as dimethylamino (DMA) silane or other silanols. The silanols may include multiple functional groups, for example, to normalize and functionalize the substrate for subsequent processes. Examples of hydrophobic masking layers are described in U.S. patent application Ser. No. 11/647,882, filed on Dec. 29, 2006 and entitled "Substrate Processing Including A Masking Layer", which is herein incorporated by reference. In another example, the masking material may be polyvinyl alcohol (PVA) having any level of hydrolysis (e.g., 90-100%) and any molecular weight (e.g., 9-250 kDa), cationic starches, polyethylene glycol (PEG) or mixtures thereof. Examples of hydrophilic masking materials are described in U.S. patent application Ser. No. 12/172,110, filed on Jul. 11, 2008, and entitled "Surface Modification of Low-K Dielectric Materials", which is herein incorporated by reference.

In some examples, an amine contaminated layer is left on the substrate 200 after CMP. The amine contaminated layer can inhibit or interrupt the formation of the masking layer 208. The application of hydroquinone removes the amine contaminated layer, improving application of the masking layer 208. Additionally, the application of hydroquinone was also found to improve the time dependent dielectric breakdown (TDDB) characteristics and voltage ramp breakdown (VRB) characteristics of the substrate 200. FIGS. 3A-3D show examples of improved characteristics of a substrate when processed with hydroquinone. Hydroquinone has also been shown to reduce metal particle formation on dielectrics during electroless deposition. Examples of reduced metal particle formation are discussed regarding FIGS. 3E and 3F.

In operation 114, a deposition process is performed. The deposition process may be an aqueous deposition process, such as electroless deposition or electrochemical deposition. Other deposition techniques, such as PVD, ALD, or CVD, or combinations of processes, can also be used. In the case of electroless deposition, in one example, dimethylamine borane (DMAB) is deposited onto the substrate 200 prior to introduction of the electroless solution. The electroless solution includes a metal ion for deposition, such as cobalt or nickel. Various alloys may be formed with other elements such as boron, phosphorous, and tungsten. In one embodiment, a solution including DMAB with an electroless solution is deposited for a desired amount of time (e.g., 1 to 100 s) at a desired temperature (e.g., 10-90° C.). A sample electroless solution that can be used with the process 100 to deposit a cobalt tungsten layer includes cobalt sulfate ($CoSO_4$) as a source of cobalt ions, citric acid (CA) as a complexing agent, ammonium chloride ($NH_4Cl$) as a buffering agent, phosphotungstic acid ($H_3PW_{12}O_{40}$) as a source of tungsten, hypophosphorous acid ($H_2PO_3$) as a reducing agent, and tetramethylammonium hydroxide (TMAH). DMAB may also be added to the solution. TMAH may further be added to achieve a desired pH, for example between 8 and 10. In one embodiment, the solution includes 0.116M (in solution) $CoSO_4$, 25% TMAH, 0.348M CA, 1.044M $NH_4Cl$, 0.0029M $H_3P W_{12}O_{40}$, 0.467M $H_2PO_3$ and TMAH as needed to achieve a 9.6 pH, balance water. Other concentrations are possible, depending on the desired properties of the capping layer. Various other electroless solutions may be used to form capping layers including cobalt, nickel, and various alloys such as cobalt tungsten phosphorous (CoWP), and cobalt tungsten phosphorous boron (CoWPB).

Figure 2D:
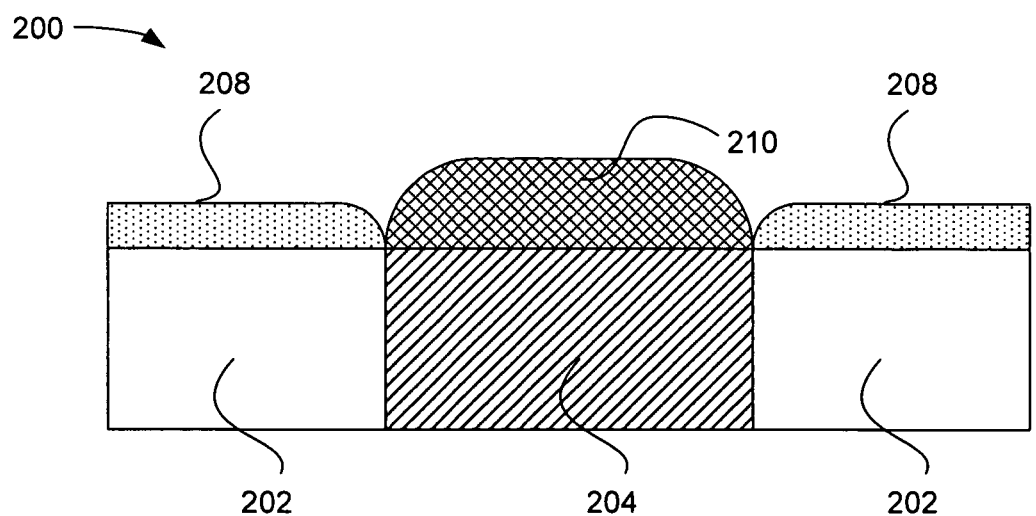

The deposition process forms a capping layer 210 as shown in FIG. 2D. The size of the capping layer 210 can be controlled by various deposition parameters, including chemical composition, concentration, temperature, and length of plating bath exposure. For example, by reducing the temperature or the length of the plating bath exposure, the thickness of the capping layer 210 can be reduced.

Figure 2E:
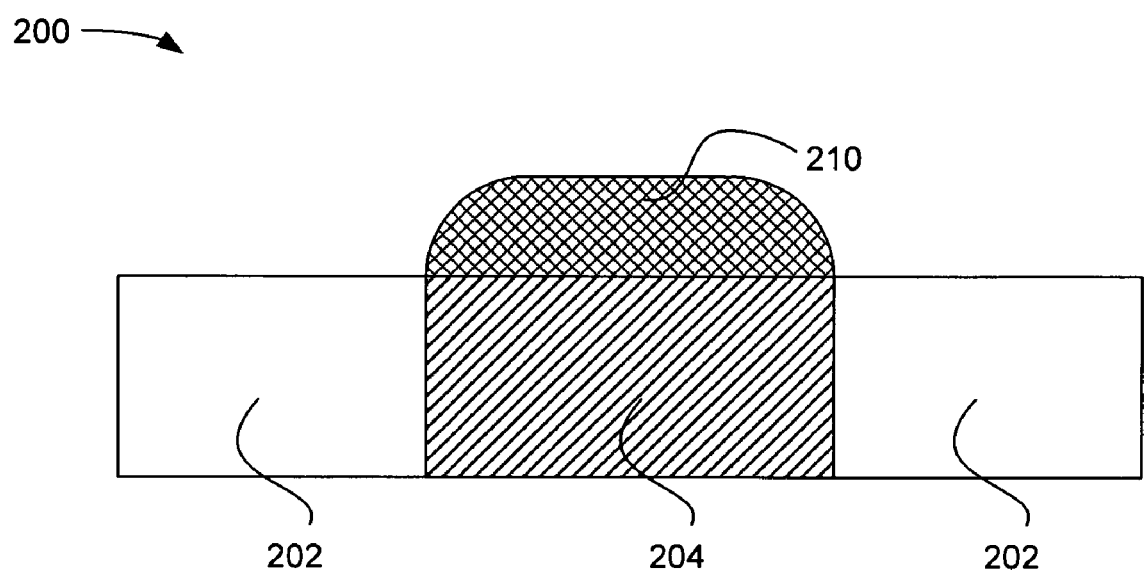

In operation 116, a final rinse is performed. The final rinse may include one or more deionized (DI) water rinses, which may be hot or cold, as well as a hot water rinse. The final rinse may include removing the masking layer. For example, if the masking layer is PVA or starch, the masking layer 208 can be removed by washing hot water over the substrate 208. The removal of the masking layer 208 can also serve to further remove any additional contaminants that may be on the substrate 200. For example, the masking layer 208 can be configured to adsorb contaminants, which are removed from the substrate 200 when the masking layer 208 is removed. FIG. 2E illustrates the substrate 200 with the masking layer 208 removed. In operation 118, the substrate can optionally be dried to complete the process 100.

Although a capping application is described here, hydroquinone can be used to improve the characteristics of various other semiconductor processes. For example, hydroquinone can be used during any portion of an interconnect fabrication scheme, such as after a cleaning step and prior to another aqueous process such as another cleaning process, another deposition process (e.g., electroplating), or an etching process. Various ones of the operations 102-118 may be omitted, supplemented, modified, or reordered for to suit various other applications.

Hydroquinone to Reduce Particle Formation and Improve TDDB and VRB

Figure 3A:
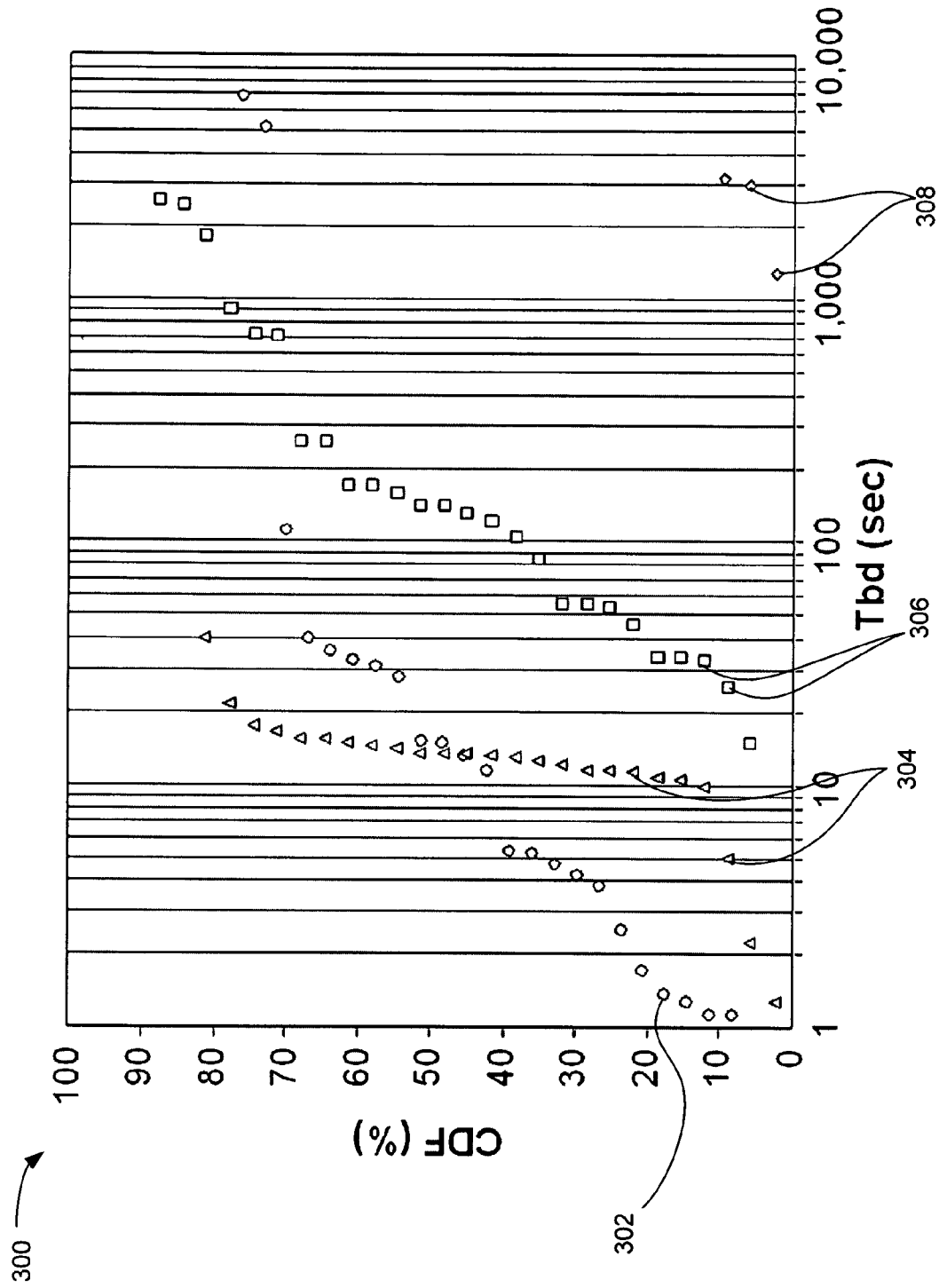
FIG. 3A is a graph illustrating improved time dependent dielectric breakdown (TDDB) characteristics of substrates treated with hydroquinone.

FIG. 3A is a graph 300 illustrating improved time dependent dielectric breakdown (TDDB) characteristics of substrates treated with hydroquinone. The substrates used are patterned SiCN (silicon carbonitride) wafers. The wafers include copper comb structures separated by SiCN dielectric. The graph 300 includes four plots 302-308, and shows time in seconds before breakdown on the x-axis, and the percentage of sites on the substrate that have broken down by a certain time on the y-axis. The plot 302 (having points represented by circles) shows the breakdown of a substrate that has been precleaned (e.g., with MR10 and ESC-700 Series products). The plot 304 (having points represented by triangles) shows the breakdown on a substrate as received, without any processing. The plot 306 shows (having points represented by squares) shows the breakdown on a substrate treated with 20 mM hydroquinone (e.g., using the process described above in operation 108) and having an electroless deposition performed on the substrate, here using the solution described above regarding operation 114. The plot 308 shows a substrate treated with 20 mM hydroquinone without further processing. As can be seen, the plots 306 and 308 that represent substrates treated with hydroquinone had longer times before dielectric breakdown. Therefore, hydroquinone improves the performance and stability of the processed substrate. Hydroquinone can also improve the leakage performance of the substrate.

Figure 3B:
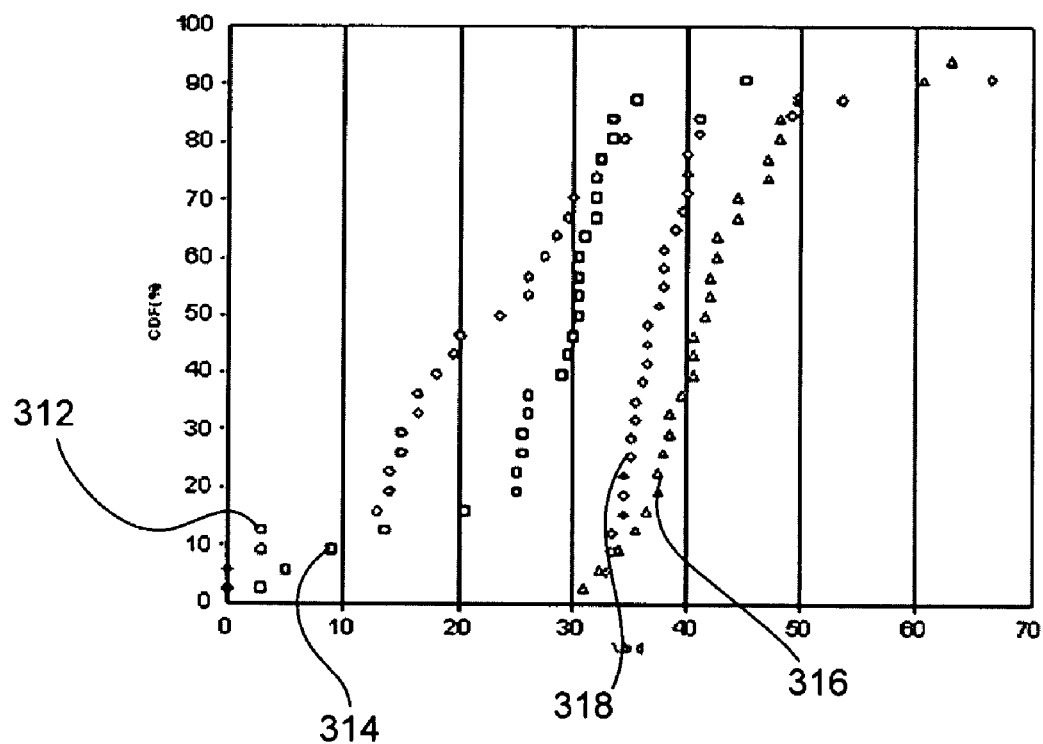
FIGS. 3B-3D are graphs showing voltage ramp breakdown of substrates including features (e.g., conductive lines) of varying sizes and spacing.
Figure 3C:
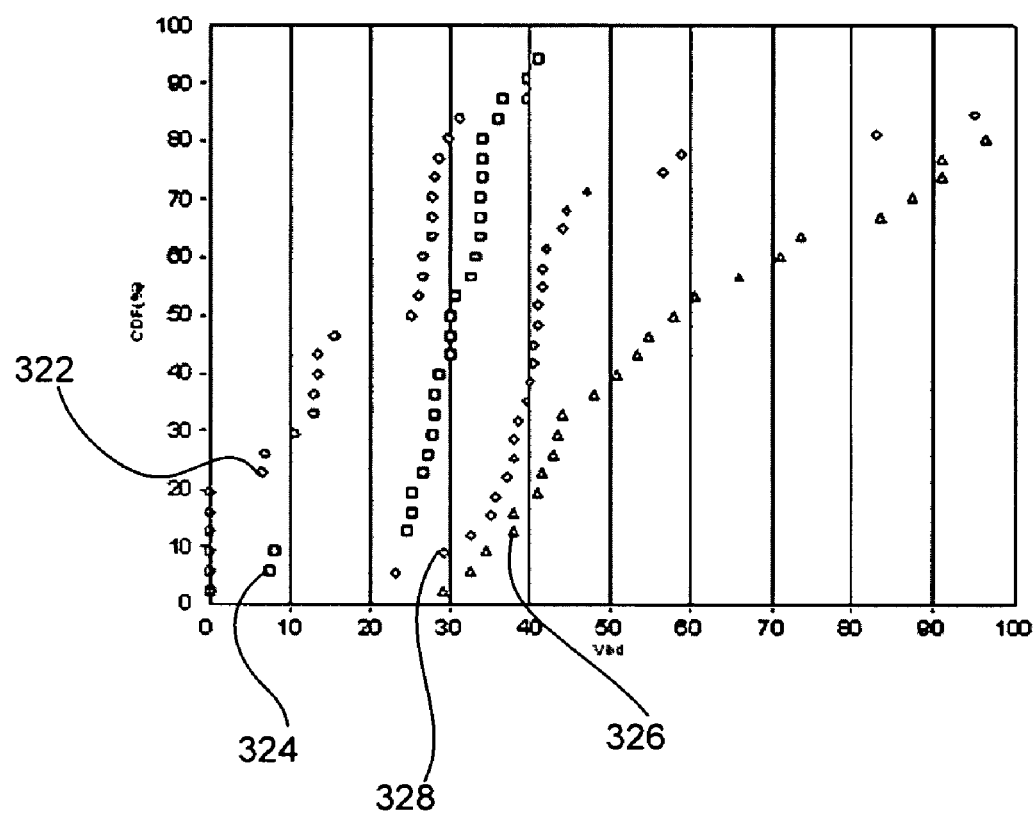
Figure 3D:
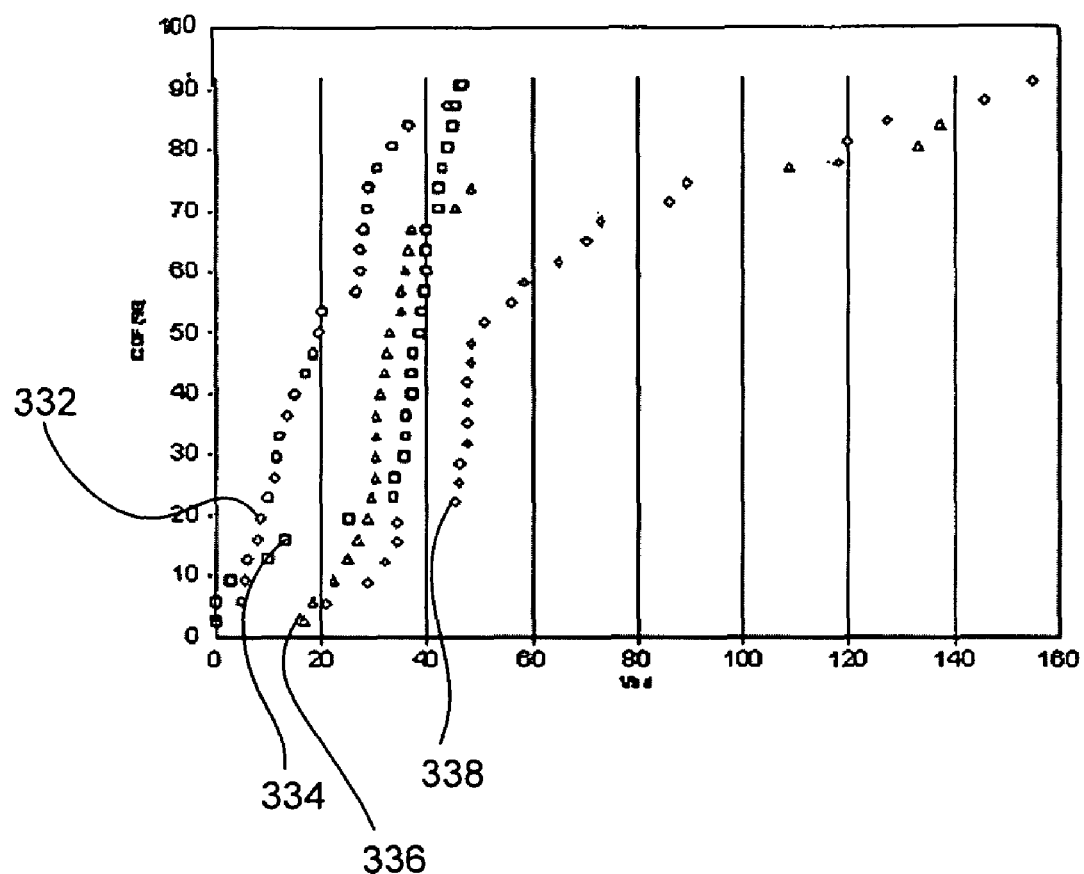

FIGS. 3B-3D are graphs showing voltage ramp breakdown of substrates including features (e.g., conductive lines) of varying sizes and spacing. The graph 310 illustrates VRB on a SiCN substrate with comb structures having conductive lines that are 0.125 μm wide and 0.15 μm spacing between lines. The graph 320 illustrates VRB on a SiCN substrate with comb structures having conductive lines that are 0.15 μm wide and 0.20 μm spacing between lines. The graph 330 illustrates VRB on a SiCN substrate with comb structures having conductive lines that are 0.175 μm wide and 0.225 μm spacing between lines.

The plots 312, 322, and 332 (shown using circles) are substrates that were processed using a pre-clean only. The plots 314, 324, and 334 (shown using squares) are substrates that were processed with 20 mM hydroquinone and an electroless deposition. The plots 316, 326, and 334 (shown using triangles) are substrates as received, without processing. The plots 318, 328, and 338 (shown using diamonds) are substrates that were processed using a pre-clean and 20 mM hydroquinone.

As can be seen, of the processed substrates, those treated with hydroquinone show less and slower VRB. The plots 318, 328, and 338, which represent the VRB of substrates that include a pre-clean and hydroquinone, show much less breakdown that the plots 312, 322, and 332, which represent the VBR of substrates processed using a pre-clean alone, which indicates that hydroquinone significantly improves VBR characteristics.

Figure 3E:
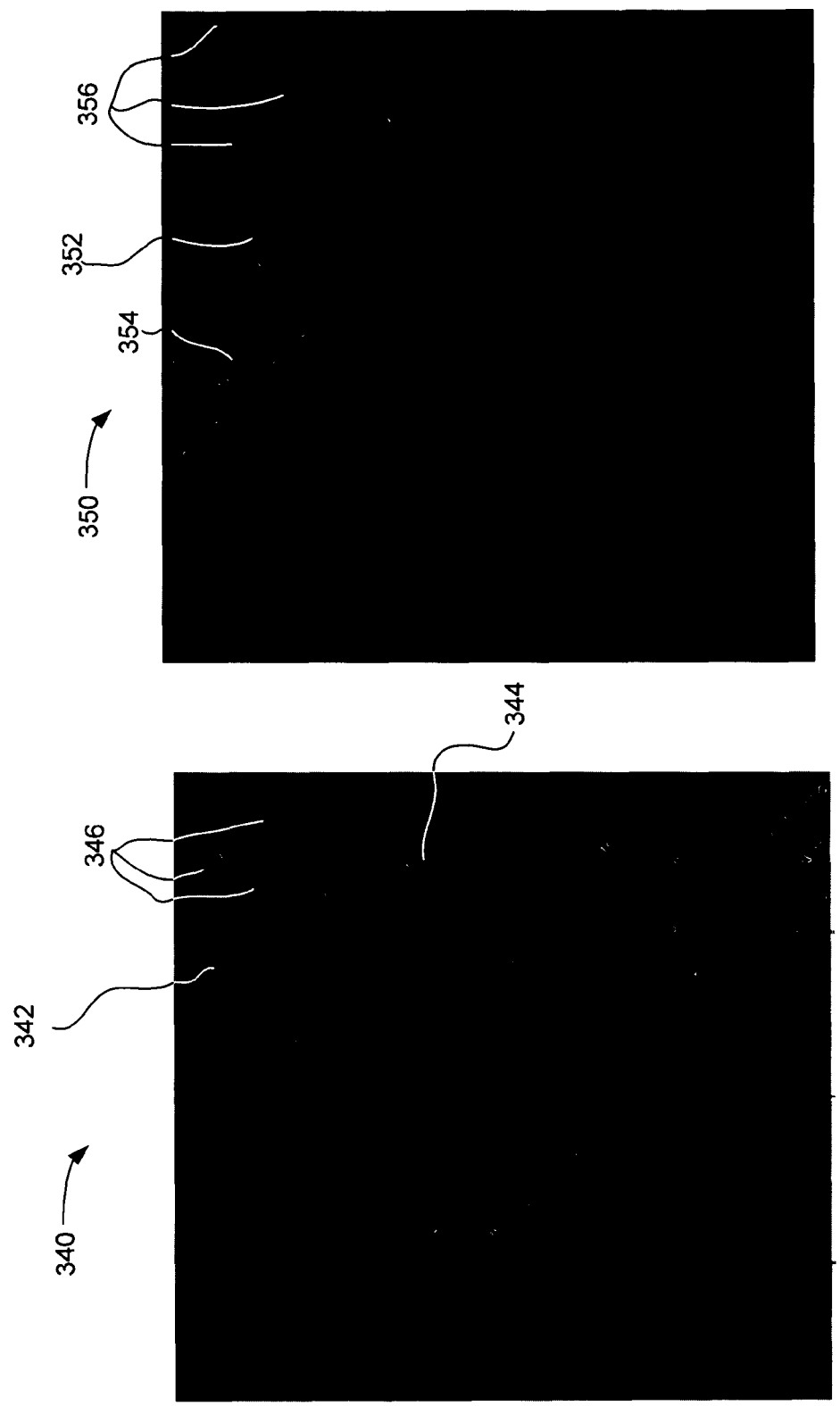
FIGS. 3E and 3F are processed patterned substrates showing improved particle formation when using hydroquinone.
Figure 3F:
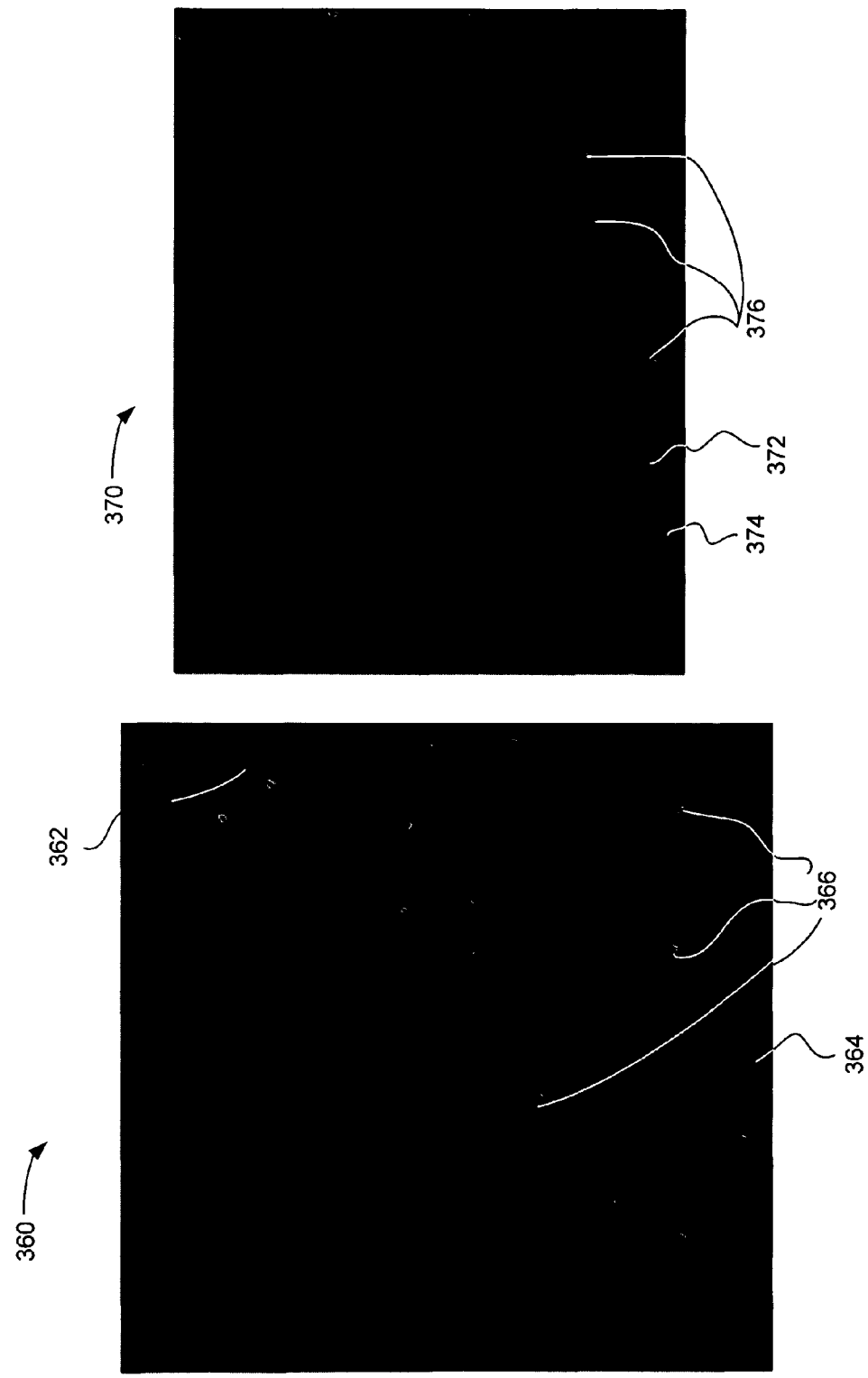

FIGS. 3E and 3F are processed patterned substrates showing improved particle formation when using hydroquinone. FIG. 3E shows images 340 and 350 of copper comb structures (i.e., conductive regions) 342 and 352 on a patterned SiCN substrate having an electroless layer deposited on the comb structures 342 and 352 without treating the substrate with hydroquinone. Dielectric regions (SiCN) 344 and 354 are also shown. The images 340 and 350 are of two different substrates processed using the same process conditions. The process conditions were using a post-CMP clean of ESC784, a preclean of MR-10, a hot water rinse, and an electroless deposition using the solution described above regarding operation 114. With both substrates, significant metal particles 346 and 356 are formed on the dielectric regions 344 and 354. The particles 346 and 356 can cause undesirable electrical characteristics, including shorting between the conductive lines, increased roughness, as well as affecting subsequent layers.

FIG. 3F shows images 360 and 370 of copper comb structures 362 and 372 on a patterned SiCN substrate having an electroless layer deposited on the comb structures 362 and 372 and treating the substrate with hydroquinone prior to electroless deposition. Dielectric regions (SiCN) 364 and 374 in the comb structures 362 and 372 are also shown. The images 360 and 370 are of two different substrates processed using the same process conditions. The process conditions were using a post-CMP clean of ESC784, a preclean of MR-11, hydroquinone application, a hot water rinse, and an electroless deposition using the solution described above regarding operation 114. With both substrates, significantly fewer metal particles 366 and 376 have formed on the dielectric regions 364 and 374 when compared to the electroless deposition performed without hydroquinone. The treatment including hydroquinone therefore improves characteristics of the processed substrates.

Although the foregoing examples have been described in some detail for purposes of clarity of understanding, the invention is not limited to the details provided. There are many alternative ways of implementing the invention. The disclosed examples are illustrative and not restrictive.

What is claimed:
1. A method, comprising:
cleaning a substrate using a preclean process, the substrate comprising a dielectric region and a conductive region;
introducing a hydroquinone to the substrate after cleaning the substrate using the preclean operation; and
forming a capping layer over the conductive region of the substrate after introducing the hydroquinone.
2. The method of claim 1, further comprising introducing the hydroquinone to remove contaminants from the substrate and prevent adhesion of contaminants to the substrate.

3. The method of claim 2, wherein the contaminants comprise amine contaminated layers.

4. The method of claim 2, wherein the contaminants comprise electroless cobalt particles.

5. The method of claim 1, further comprising:
- performing a chemical mechanical polishing (CMP) of the substrate before cleaning the substrate using the preclean process; and
- cleaning the substrate using a CMP postclean process after the CMP and before the cleaning the substrate using the preclean process.

6. The method of claim 1, wherein forming the capping layer comprises forming an electroless capping layer over the conductive region.

7. The method of claim 1, wherein introducing the hydroquinone comprises introducing an aqueous solution comprising the hydroquinone and tetrabutylammonium acetate to the substrate.

8. The method of claim 1, wherein the substrate includes a dielectric chosen from the group consisting of silicon oxide, silicon oxycarbide (SiCOH), silicon nitride, silicon carbide, silicon carbonitride (SiCN) and low-k dielectrics.

9. The method of claim 1, further comprising masking the dielectric region before the forming the capping layer.

10. The method of claim 9, wherein the masking uses a masking material chosen from the group consisting of silanols, dimethyamino(DMA)-silane, polyvinyl alcohol (PVA), starches, polyethylene glycol (PEG) and combinations thereof.

* * * * *